(12) United States Patent
Huang (10) Patent No.: US 7,659,139 B2
(45) Date of Patent: Feb. 9, 2010

(54) METHOD FOR DESTRUCTION OF METALLIC CARBON NANOTUBES, METHOD FOR PRODUCTION OF AGGREGATE OF SEMICONDUCTING CARBON NANOTUBES, METHOD FOR PRODUCTION OF THIN FILM OF SEMICONDUCTING CARBON NANOTUBES, METHOD FOR DESTRUCTION OF SEMICONDUCTING CARBON NANOTUBES, METHOD FOR PRODUCTION OF AGGREGATE OF METALLIC CARBON NANOTUBES, METHOD FOR PRODUCTION OF THIN FILM OF METALLIC CARBON NANOTUBES, METHOD FOR PRODUCTION OF ELECTRONIC DEVICE, METHOD FOR PRODUCTION OF AGGREGATE OF CARBON NANOTUBES, METHOD FOR SELECTIVE REACTION OF SEMICONDUCTING CARBON NANOTUBES

(75) Inventor: Houjin Huang, Kanagawa (JP)

(73) Assignee: Sony Corporation, Tokyo (JP)

( * ) Notice: Subject to any disclaimer, the term of this patent is extended or adjusted under 35 U.S.C. 154(b) by 198 days.

(21) Appl. No.: 11/459,782

(22) Filed: Jul. 25, 2006

(65) Prior Publication Data
US 2010/0003809 A1 Jan. 7, 2010

(30) Foreign Application Priority Data
Jul. 29, 2005 (JP) ............................. P2005-219846

(51) Int. Cl.
*H01L 51/40* (2006.01)
*H01L 21/44* (2006.01)

(52) U.S. Cl. ........................... 438/99; 438/597; 257/40; 257/E51.001; 257/E51.049; 977/742; 977/750; 977/752

(58) Field of Classification Search ................. 438/795, 438/487, 99, 597; 257/40, 203, 213, 20, 257/E51.001, E51.049; 977/742, 750, 752
See application file for complete search history.

(56) References Cited

U.S. PATENT DOCUMENTS

2008/0069758 A1* 3/2008 Campbell ................ 423/445 B
2008/0093211 A1* 4/2008 Ramanath et al. ....... 204/157.63

FOREIGN PATENT DOCUMENTS

JP    2001146409    5/2001

(Continued)

OTHER PUBLICATIONS

F. Banhart, "Irradiation of carbon nanotubes with a focused electron beam in the electron microscope," J Mater Sci (2006) 41, 4505-4511.*

(Continued)

*Primary Examiner*—Walter L Lindsay, Jr.
(74) *Attorney, Agent, or Firm*—K&L Gates LLP (57) ABSTRACT

A method for destruction of metallic carbon nanotubes is provided. The method includes irradiating a mixture of semiconducting carbon nanotubes and metallic carbon nanotubes with energy beams (such as laser light), thereby selectively destroying metallic carbon nanotubes or semiconducting carbon nanotubes. The energy beams have energy components for resonance absorption by the metallic carbon nanotubes or semiconducting carbon nanotubes.

16 Claims, 11 Drawing Sheets

FOREIGN PATENT DOCUMENTS

| JP | 2004284852 | 10/2004 |
| JP | 200545188 | 2/2005 |
| JP | 2005067976 A * | 3/2005 |

OTHER PUBLICATIONS

Y. Zhang et al., "Strong visible light emission from well-aligned multiwalled carbon nanotube films under infrared laser irradiation", Oct. 20, 2005, Applied Physics Letters 87, p. 173114-1-173114-3.*

Baughman et al., "Carbon nanotubes-the route toward application", Aug. 2, 2002, Science 297, 5582, p. 787-792.*

S. Suzuki et al., Formation of single-wall carbon nanotubes in Ar and nitrogen gas atmosphere by using laser furnace technique The European May 24, 2007, Physical Journal D, 43, p. 143-146.*

Bachtold et al., "Logic Circuits with Carbon Nanotube Transistors," Science, vol. 294, p. 1317-1319, 2001.

Chattopadhyay et al., "A Route for Bulk Separation of Semiconducting from Metallic Single-Wall Carbon Nanotubes," Journal of the American Chemical Society, vol. 13=25, p. 3370-3375, 2003.

Chen et al., "Bulk Separative Enrichment in Metallic or Semiconducting Single-Walled Carbon Nanotubes,"NANO Letters, vol. 3, p. 1245-1249, 2003.

Choi et al., "Efficient Formation of Iron Nanoparticle Catalyst on Silicon Oxide by Hydroxylamine for Carbon Nanotube Synthesis and Electronics," NANO Letters, vol. 3, p. 157-161, 2003.

Collins et al., "Engineering Carbon Nanotubes and Nanotube Circuits Using Electrical Breakdown," Science, vol. 292, p. 706-709, 2001.

Derycke et al., "Carbon Nanotube Inter- and Intramolecular Logic Gates," NANO Letters, vol. 1, p. 453-456, 2001.

Hassanien et al., "Selective etching of metallic singled-wall carbon nanotubes with hydrogen plasma," Nanotechnology, vol. 16 p. 278-281, 2005.

Javey et al., "Carbon Nanotube Transistor Arrays for Multistage Complementary Logic and Ring Oscillators," NANO Letters, vol. 2, p. 929-932, 2002.

Krupke et al., "Separation of Metallic from Semiconducting Single-Walled Carbon Nanotubes," Science, vol. 301, p. 344-347, 2003.

Lay et al., "Simple Route to Large-Scale Ordered Arrays of Liquid-Deposited Carbon Nanotubes," NANO Letters, vol. 4, p. 603-606, 2004.

Li et al., "Carbon Nanotube Transistor Operation at 2.6 GHz," NANO Letters, vol. 4, p. 753-756, 2004.

Li et al., "Preferential Growth of Semiconducting Single-Walled Carbon Nanotubes by a Plasma Enhanced CVD Method," NANO Letters, vol. 4, p. 317-321, 2004.

Tans et al., "Room-temperature transistor based on a single carbon nanotube," Nature, vol. 393, p. 49-52, 1998.

Zheng et al., "DNA-assisted dispersion and separation of carbon nanotubes," Nature Materials, vol. 2, p. 338-342, 2003.

* cited by examiner

METHOD FOR DESTRUCTION OF METALLIC CARBON NANOTUBES, METHOD FOR PRODUCTION OF AGGREGATE OF SEMICONDUCTING CARBON NANOTUBES, METHOD FOR PRODUCTION OF THIN FILM OF SEMICONDUCTING CARBON NANOTUBES, METHOD FOR DESTRUCTION OF SEMICONDUCTING CARBON NANOTUBES, METHOD FOR PRODUCTION OF AGGREGATE OF METALLIC CARBON NANOTUBES, METHOD FOR PRODUCTION OF THIN FILM OF METALLIC CARBON NANOTUBES, METHOD FOR PRODUCTION OF ELECTRONIC DEVICE, METHOD FOR PRODUCTION OF AGGREGATE OF CARBON NANOTUBES, METHOD FOR SELECTIVE REACTION OF SEMICONDUCTING CARBON NANOTUBES

CROSS REFERENCES TO RELATED APPLICATIONS

The present application claims priority to Japanese Patent Application JP 2005-219846 filed in the Japanese Patent Office on Jul. 29, 2005, the entire contents of which being incorporated herein by reference.

BACKGROUND

The present invention generally relates to a method for destruction of metallic carbon nanotubes, a method for production of aggregate of semiconducting carbon nanotubes, a method for production of thin film of semiconducting carbon nanotubes, a method for destruction of semiconducting carbon nanotubes, a method for production of aggregate of metallic carbon nanotubes, a method for production of thin film of metallic carbon nanotubes, a method for production of electronic device, a method for production of aggregate of carbon nanotubes, a method for selective reaction of metallic carbon nanotubes, and a method for selective reaction of semiconducting carbon nanotubes. More specifically, the present invention, for example, can be applied to thin-film transistors (TFT) in which thin film of carbon nanotubes is used as the channel material.

Among the promising semiconductor electron materials of next generation is semiconducting single-wall carbon nanotubes. This is because semiconducting single-wall carbon nanotubes exhibit not only better electrical properties than silicon (as the major channel material of TFT) but also outstanding mechanical properties that will permit their application to flexible electronics. A field effect transistor (FET) that operates at room temperature with one single-wall carbon nanotube was realized in 1998 for the first time. See, Tans, S. J. et al., Nature, 1998, 393, 49. The possibility of inverter (as one of the simplest logic gates) has been proven with unipolar and complementary carbon nanotube FETs. Other logical gates such as NOR, AND, and SRAM have been constructed in the complementary or multistage complementary mode. A ring oscillator with a maximum oscillating frequency of 220 Hz was formed from a simple array of p-type and n-type carbon nanotube FETs. See, Bachtol, A. et al., Science, 2001, 294, 1317; Derycke et al., Nano Lett. 2001, 1, 453; Javey, A., Nano Lett. 2002, 2, 929. A 2.6 GHz transistor of carbon nanotubes has recently been demonstrated. See, Li S. et al., Nano Lett. 2004, 4, 753.

Attempts to apply single-wall carbon nanotubes to semiconductor electronics have been unsuccessful so far because they contain both metallic ones and semiconducting ones so long as they are synthesized by any exiting technology. Single-wall carbon nanotubes can be metallic or semiconducting depending on their chirality, which is an angle at which the graphite lattice (or graphene sheet) helically rounds about the tubular contour of the nanotube. Metallic carbon nanotubes (which account for about one-third of total nanotubes) greatly aggravate the FET characteristics, such as on/off ratio. It is impossible to adjust the on/off ratio with a network film of untreated carbon nanotubes. In fact, a network film of carbon nanotubes has an on/off ratio lower than 10, which is too small for any practical application. See, Tans, S. J. et al., Nature, 1998, 393, 49. How to address the problem with metallic carbon nanotubes has been a major point in this field.

There have been reported several ways of addressing the problem with metallic carbon nanotubes. The first one is by growing semiconducting carbon nanotubes preferentially. The second one is by separating semiconducting carbon nanotubes from a mixture of metallic carbon nanotubes and semiconducting carbon nanotubes. The third one is by selectively destructing metallic carbon nanotubes in a mixture of metallic carbon nanotubes and semiconducting carbon nanotubes.

There is only one report about the first method as far as the present inventors know. See, Japanese Patent Laid-open No. 2005-45188. This report says that plasma-enhanced chemical vapor deposition (PECVD) at 600° C. yields metallic carbon nanotubes and semiconducting carbon nanotubes in a ratio of 100 to about 89. This result, however, has not yet been confirmed by other researchers. Some researchers suggest that the foregoing result is due to destruction of metallic carbon nanotubes induced by hydrogen plasma rather than preferential growth. See, Hassanien A, NANOTECHNOLOGY 16 (2): 278-281 FEB 2005. Even though preferential grow is possible, there is ample room for improvement in selectivity.

The second method mentioned above has been reported several times in the past three years. The reported methods for separation include alternating current dielectrophoresis (see, Krupke R. et al., Science, 2003, 301, 344), selective precipitation of metallic carbon nanotubes with the help of physical adsorption by octadecylamine or bromine (see, Chattophadhyay D. et al., J. Am. Chem. Soc. 2003, 125, 370; Chen Z. et al., Nano Lett. 2003, 3, 1245), and chromatography of DNA-coated carbon nanotubes (see, Zheng M. et al., Nature materials, 2003, 2, 338). The results reported in these papers are unsatisfactory (quantitatively and qualitatively). In addition, the above-mentioned methods are all subject to chemical contamination because of complex physical or chemical processes involved.

The third method mentioned above involves destruction of metallic carbon nanotubes by electric current. (See, Collin P. et al., Science, 2001, 292, 706) This method is based on the fact that semiconducting carbon nanotubes can be made "off" upon application of gate voltage. It is possible to burn out metallic carbon nanotubes by application of a high source-drain voltage in the presence of oxygen. The first disadvantage of this method is that current flowing through metallic carbon nanotubes generates Joule heat that might burn out their adjacent semiconductor carbon nanotubes. The second disadvantage is inefficiency for a device composed of a large number of FETs because each FET has to be supplied with current. There is another known method of depositing carbon nanotubes on a substrate by in-situ CVD or solution process. (See, Chio et al., Nano Lett. 2003, 3, 157; Lay et al., Nano Lett. 2004, 4, 603.)

SUMMARY

It is desirable to provide a method for easy and complete destruction of metallic carbon nanotubes.

It is desirable to provide a method for easy production of aggregate of semiconducting carbon nanotubes, a method for easy production of thin film of semiconducting carbon nanotubes, and a method for production of electronic devices with aggregate or thin film of semiconducting carbon nanotubes.

It is desirable to provide a method for easy and complete destruction of semiconducting carbon nanotubes.

It is desirable to provide a method for easy production of aggregate of metallic carbon nanotubes, a method for easy production of thin film of metallic carbon nanotubes, and a method for production of electronic devices with aggregate or thin film of metallic carbon nanotubes.

It is desirable to provide a method for easy production of carbon nanotube aggregate composed of semiconducting carbon nanotubes having uniform characteristic properties and a method for easy production of carbon nanotube aggregate composed of metallic carbon nanotubes having uniform characteristic properties.

It is desirable to provide a method for easy selective reaction of metallic carbon nanotubes and a method for easy selective reaction of semiconducting metallic carbon nanotubes.

As the result of their research into the above-mentioned problems involved in the technology in the related art, the present inventors unexpectedly found that metallic carbon nanotubes can be selectively destroyed by irradiation with laser beams. Presumably, this phenomenon is due to resonance absorption of incident laser beams by metallic carbon nanotubes and destruction of metallic carbon nanotubes by absorbed energy. This means that metallic carbon nanotubes can be selectively destroyed by irradiation with laser beams having energy suitable for resonance absorption by metallic carbon nanotubes to be destroyed. Likewise, semiconducting carbon nanotubes can also be selectively destroyed by irradiation with laser beams having energy suitable for resonance absorption by semiconducting carbon nanotubes to be destroyed. The mechanism of destruction apparently suggests that the laser beams may be replaced by any other energy beams such as electron beams so long as they have energy components for resonance absorption by metallic carbon nanotubes or semiconducting carbon nanotubes to be destroyed.

The present inventors also found that metallic carbon nanotubes efficiently undergo selective reactions when excited by irradiation with energy beams (such as laser beams) in an environment containing a reactive substance. Similarly, semiconducting carbon nanotubes efficiently undergo selective reactions when excited by irradiation with energy beams (such as laser beams) in an environment containing a reactive substance.

The first embodiment of the present invention is directed to a method for destroying metallic carbon nanotubes which includes irradiating metallic carbon nanotubes with energy beams.

The method of the embodiment employs energy beams for irradiation which have energy components for resonance absorption by metallic carbon nanotubes to be destroyed. A typical example of such energy beams is one which has an energy component equal to the first electron excitation energy of metallic carbon nanotubes, which is the energy $M_{11}$ for the first van Hove electronic transition $vm1 \rightarrow cm1$. This energy beam should have an energy of 10-6 to 103 eV, preferably 0.1 to 10 eV, and most desirably 1 to 5 eV. The power density of irradiation with the energy beam should be 10-3 to 103 mW\$\mu m^2$, preferably 0.1 to 10 mW/$\mu m^2$. The energy beam commonly used is laser beams. Electron beams and light (other than laser beams) may also be used.

The metallic carbon nanotubes used in the present invention in an embodiment should preferably be single-wall metallic carbon nanotubes; however, it may also include double-wall or multi-wall metallic carbon nanotubes. The metallic carbon nanotubes should have a diameter of 0.4 to 10 nm, preferably 0.4 to 3 nm. The metallic carbon nanotubes should have a length of 1 to 106 nm, preferably 10 to 104 nm. The metallic carbon nanotubes should preferably be in the form of thin film with an average thickness of 0.001 to 105 nm, although they may also be in the form of single substance.

The second embodiment of the present invention is directed to a method for producing an aggregate of semiconducting carbon nanotubes, the method comprising irradiating a mixture of metallic carbon nanotubes and semiconducting carbon nanotubes with energy beams, thereby selectively destroying the metallic carbon nanotubes. The energy beams for irradiation should have energy components for resonance absorption by metallic carbon nanotubes to be destroyed. The aggregate of semiconducting carbon nanotubes is not specifically restricted; it may be in the form of thin film or in any other form.

What is mentioned about the first embodiment of the present invention is applicable to the second embodiment of the present invention so long as there are no contradictions.

The third embodiment of the present invention is directed to a method for producing a thin film of semiconducting carbon nanotubes, the method comprising irradiating a thin film formed from a mixture of metallic carbon nanotubes and semiconducting carbon nanotubes with energy beams, thereby selectively destroying the metallic carbon nanotubes.

The energy beams for irradiation should have energy components for resonance absorption by metallic carbon nanotubes to be destroyed.

The thin film of semiconducting carbon nanotubes will be used for various electronic devices such as solar cells, photoelectric converters, light-emitting elements, TFTs, memories, and chemical sensors. It will find use in broad application areas. To be concrete, the thin film of semiconducting carbon nanotubes will be used for photoelectric converting layers, channel material of TFTs, and transparent electrodes.

The thin film of semiconducting carbon nanotubes varies in shape ranging from a continuous film (in which semiconducting carbon nanotubes are densely packed) to an extremely thin film (in which semiconducting carbon nanotubes form a net-like structure).

What is mentioned about the first embodiment of the present invention is applicable to the third embodiment of the present invention so long as there are no contradictions.

The fourth embodiment of the present invention is directed to a method for producing an electronic element with aggregate of semiconducting carbon nanotubes, the method comprising forming a mixture of metallic carbon nanotubes and semiconducting carbon nanotubes and irradiating the mixture with energy beams, thereby selectively destroying the metallic carbon nanotubes and forming the aggregate of semiconducting carbon nanotubes.

The electronic element is not specifically restricted so long as it has aggregate of semiconducting carbon nanotubes. It includes, for example, solar cells, photoelectric converters, light-emitting elements, FETs (such as TFTs), memories, and chemical sensors.

What is mentioned about the first and second embodiments of the present invention is applicable to the fourth embodiment of the present invention so long as there are no contradictions.

The fifth embodiment of the present invention is directed to a method for producing an electronic element with thin film of semiconducting carbon nanotubes, the method comprising forming a thin film from a mixture of metallic carbon nanotubes and semiconducting carbon nanotubes and irradiating the thin film with energy beams, thereby selectively destroying the metallic carbon nanotubes and forming the thin film of semiconducting carbon nanotubes.

The electronic element is not specifically restricted so long as it has thin film of semiconducting carbon nanotubes. It includes, for example, solar cells, photoelectric converters, light-emitting elements, TFTs, memories, and chemical sensors.

What is mentioned about the first and third embodiments of the present invention is applicable to the fifth embodiment of the present invention so long as there are no contradictions.

The sixth embodiment of the present invention is directed to a method for destroying semiconducting carbon nanotubes, the method comprising irradiation with energy beams for destruction of semiconducting carbon nanotubes.

This method employs energy beams for irradiation which have energy components for resonance absorption by semiconducting carbon nanotubes to be destroyed. A typical example of such energy beams is one which has an energy component equal to the first electron excitation energy of semiconducting carbon nanotubes, which is the energy S11 for the first van Hove electronic transition vs1→cs1.

What is mentioned about the first embodiment of the present invention is applicable to the sixth embodiment of the present invention so long as there are no contradictions.

The seventh embodiment of the present invention is directed to a method for producing an aggregate of metallic carbon nanotubes, the method comprising irradiating a mixture of metallic carbon nanotubes and semiconducting carbon nanotubes with energy beams, thereby selectively destroying the semiconducting carbon nanotubes.

The energy beams for irradiation should have energy components for resonance absorption by semiconducting carbon nanotubes to be destroyed.

What is mentioned about the first and second embodiments of the present invention is applicable to the seventh embodiment of the present invention so long as there are no contradictions.

The eighth embodiment of the present invention is directed to a method for producing a thin film of metallic carbon nanotubes, the method comprising irradiating a thin film formed from a mixture of metallic carbon nanotubes and semiconducting carbon nanotubes with energy beams, thereby selectively destroying the semiconducting carbon nanotubes.

The energy beams for irradiation should have energy components for resonance absorption by semiconducting carbon nanotubes to be destroyed.

The thin film of metallic carbon nanotubes will be used for various electronic devices such as solar cells, photoelectric converters, light-emitting elements, EFTs (such as TFTs), memories, and chemical sensors. It will find use in broad application areas. To be concrete, the thin film of metallic carbon nanotubes will be used for transparent electrodes and transparent wiring (such as TFT gate electrodes).

The thin film of metallic carbon nanotubes varies in shape ranging from a continuous film (in which metallic carbon nanotubes are densely packed) to an extremely thin film (in which metallic carbon nanotubes form a net-like structure).

What is mentioned about the first and sixth embodiments of the present invention is applicable to the eighth embodiment of the present invention so long as there are no contradictions.

The ninth embodiment of the present invention is directed to a method for producing an electronic element with aggregate of metallic carbon nanotubes, the method comprising forming a mixture of metallic carbon nanotubes and semiconducting carbon nanotubes and irradiating the mixture with energy beams, thereby selectively destroying the semiconducting carbon nanotubes and forming the aggregate of metallic carbon nanotubes.

The electronic element is not specifically restricted so long as it has aggregate of metallic carbon nanotubes. It includes, for example, solar cells, photoelectric converters, light-emitting elements, FETs (such as TFTs), memories, and chemical sensors.

What is mentioned about the first, sixth, and seventh embodiments of the present invention is applicable to the ninth embodiment of the present invention so long as there are no contradictions.

The tenth embodiment of the present invention is directed to a method for producing an electronic element with thin film of metallic carbon nanotubes, the method comprising forming a thin film from a mixture of metallic carbon nanotubes and semiconducting carbon nanotubes and irradiating the thin film with energy beams, thereby selectively destroying the semiconducting carbon nanotubes and forming the thin film of metallic carbon nanotubes.

The electronic element is not specifically restricted so long as it has thin film of metallic carbon nanotubes. It includes, for example, solar cells, photoelectric converters, light-emitting elements, TFTs, memories, and chemical sensors.

What is mentioned about the first, sixth, and eighth embodiments of the present invention is applicable to the tenth embodiment of the present invention so long as there are no contradictions.

The eleventh embodiment of the present invention is directed to a method for producing carbon nanotube aggregate, the method comprising irradiating carbon nanotube aggregate containing at least more than one kind semiconducting carbon nanotubes with energy beams, thereby selectively destroying at least one kind of the semiconducting carbon nanotubes.

The carbon nanotube aggregate before irradiation with energy beams may be one which consists of more than one kind of semiconducting carbon nanotubes and one or more than one kind of metallic carbon nanotubes, or it may be one which consists solely of more than one kind of semiconducting carbon nanotubes. "More than one kind of semiconducting carbon nanotubes" may consist of semiconducting carbon nanotubes differing in electronic structure (and hence differing in resonance absorption energy, such as the first electron excitation energy). The selective destruction of semiconducting carbon nanotubes can be achieved by establishing the energy of the energy beams such that resonance absorption takes place. The selective destruction causes the remaining semiconducting carbon nanotubes (in the carbon nanotube aggregate) to have uniform characteristic properties. By repeating the selective destruction with energy beams having an energy level necessary for resonance absorption by other kinds of semiconducting carbon nanotubes, it is possible to obtain eventually only one kind of semiconducting carbon nanotubes (or it is possible to obtain semiconducting carbon nanotubes with uniform characteristic properties).

What is mentioned about the first and second embodiments of the present invention is applicable to the eleventh embodiment of the present invention so long as there are no contradictions.

The twelfth embodiment of the present invention is directed to a method for producing carbon nanotube aggregate, the method comprising irradiating carbon nanotube aggregate containing at least more than one kind of metallic carbon nanotubes with energy beams, thereby selectively destroying at least one kind of the metallic carbon nanotubes.

The carbon nanotube aggregate before irradiation with energy beams may be one which consists of more than one kind of metallic carbon nanotubes and one or more than one kind of semiconducting carbon nanotubes, or it may be one which consists solely of more than one kind of metallic carbon nanotubes. "More than one kind of metallic carbon nanotubes" may consist of semiconducting carbon nanotubes differing in electronic structure (and hence differing in resonance absorption energy, such as the first electron excitation energy). The selective destruction of metallic carbon nanotubes can be achieved by establishing the energy of the energy beams such that resonance absorption takes place. The selective destruction causes the remaining metallic carbon nanotubes (in the carbon nanotube aggregate) to have uniform characteristic properties. By repeating the selective destruction with energy beams having an energy level necessary for resonance absorption by other kinds of metallic carbon nanotubes, it is possible to obtain eventually only one kind of metallic carbon nanotubes (or it is possible to obtain metallic carbon nanotubes with uniform characteristic properties).

What is mentioned about the first and second embodiments of the present invention is applicable to the twelfth embodiment of the present invention so long as there are no contradictions.

The thirteenth embodiment of the present invention is directed to a method for selective reactions of metallic carbon nanotubes, the method comprising irradiating metallic carbon nanotubes with energy beams for selective reactions.

The energy beams for irradiation should have energy components for resonance absorption by metallic carbon nanotubes to undergo selective reactions, the energy component being able to excite metallic carbon nanotubes to the level necessary for reactive reactions.

The reaction of metallic carbon nanotubes is carried out in a gas or liquid, which contains at least one species of element selected from the group composed of hydrogen (H), oxygen (O), sulfur (S), phosphorus (P), carbon (C), nitrogen (N), fluorine (F), chlorine (Cl), bromine (Br), and iodine (I). A typical example of the gas is oxygen (O2), and a typical example of the liquid is water.

What is mentioned about the first embodiment of the present invention is applicable to the thirteenth embodiment of the present invention so long as there are no contradictions.

The fourteenth embodiment of the present invention is directed to a method for selective reactions of semiconducting carbon nanotubes, the method comprising irradiating semiconducting carbon nanotubes with energy beams for selective reactions.

The energy beams for irradiation should have energy components for resonance absorption by semiconducting carbon nanotubes to undergo selective reactions, the energy component being able to excite semiconducting carbon nanotubes to the level necessary for selective reactions.

The reaction of semiconducting carbon nanotubes is carried out in a gas or liquid, which is identical with the one mentioned in the thirteenth embodiment of the present invention.

What is mentioned about the first embodiment of the present invention is applicable to the fourteenth embodiment of the present invention so long as there are no contradictions.

The embodiments of the present invention defined above are intended to irradiate metallic carbon nanotubes or semiconducting carbon nanotubes with energy beams, thereby efficiently injecting energy into them by resonance absorption and exciting them to a level necessary for their destruction or selective reactions.

The embodiments of the present invention make it possible to surely destroy metallic carbon nanotubes or semiconducting carbon nanotubes by irradiation with energy beams which is simple and easy to practice. This method permits easy production of aggregate of semiconducting carbon nanotubes or metallic carbon nanotubes and also easy production of thin film of semiconducting carbon nanotubes or metallic carbon nanotubes. The thus produced thin film of semiconducting carbon nanotubes or metallic carbon nanotubes can be used to produce a variety of electronic devices such as high-performance TFT.

In addition, the thus produced aggregate of semiconducting carbon nanotubes or metallic carbon nanotubes has uniform characteristic properties.

The irradiation with energy beams according to an embodiment efficiently permits selective reactions of metallic carbon nanotubes or semiconducting carbon nanotubes.

Additional features and advantages are described herein, and will be apparent from, the following Detailed Description and the figures.

A detailed description with reference to the accompanying drawings is provided below.

DETAILED DESCRIPTION

Figure 1:
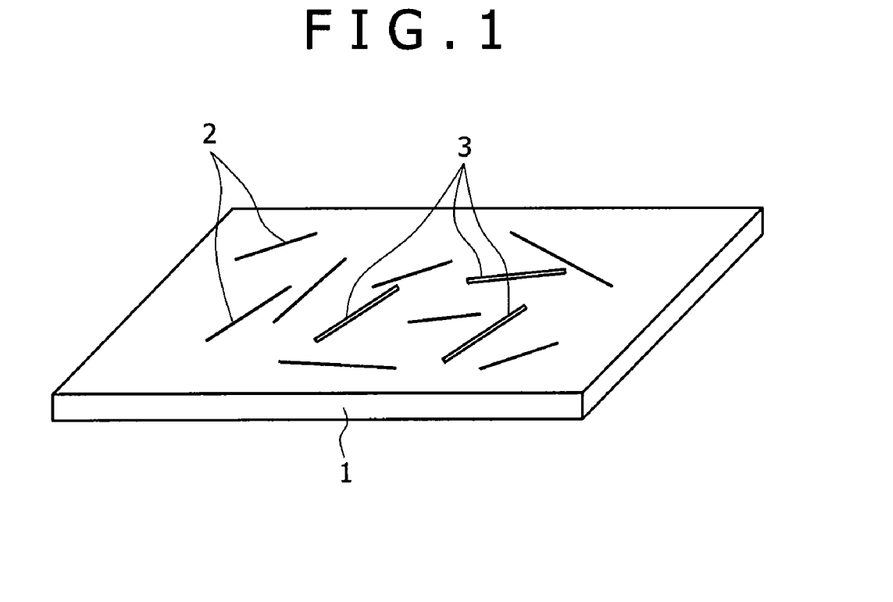
FIG. 1 is a schematic diagram illustrating the method for destroying metallic carbon nanotubes according to an embodiment of the present invention.

As shown in FIG. 1, a mixture or thin film composed of semiconducting carbon nanotubes 2 and metallic carbon nanotubes 3 (which are separated from one another) is formed on a substrate 1. The substrate 1 may be that of glass, quartz, or silicon (with or without SiO2 surface coating). It also includes any material that withstands irradiation with intense energy beams (mentioned later). The mixture composed of semiconducting carbon nanotubes 2 and metallic carbon nanotubes 3 may be deposited on the substrate 1 by in-situ CVD or solution process. The method for deposition is disclosed in Non-Patent Documents 13 and 14, and hence its detailed description is omitted herein.

Figure 2:
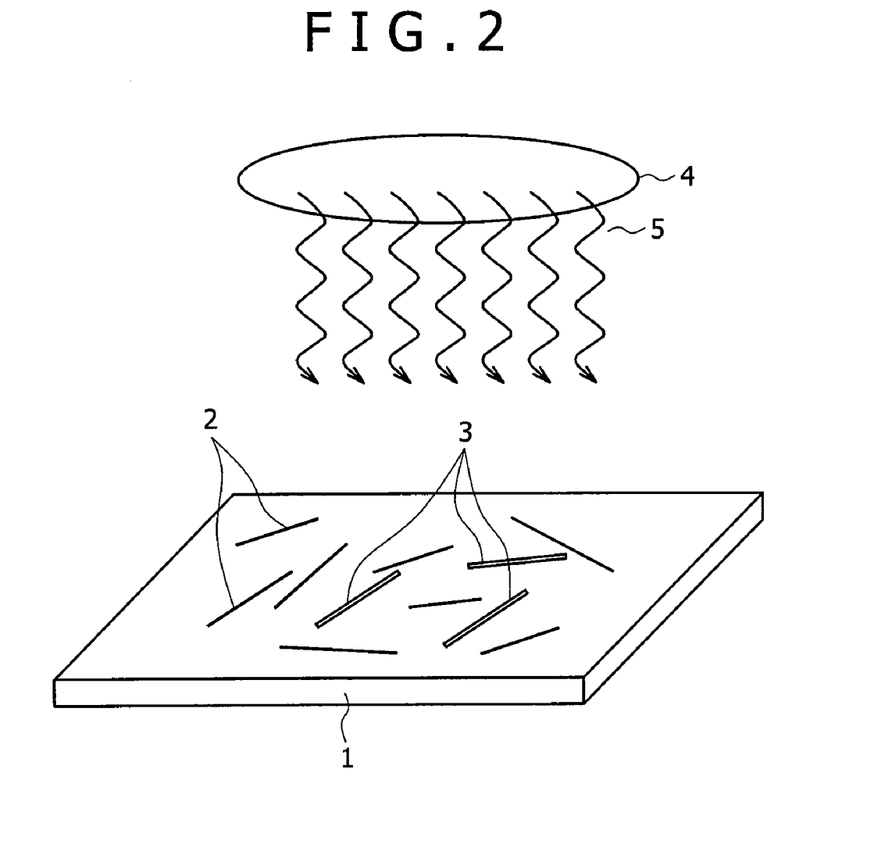
FIG. 2 is a schematic diagram illustrating the method for destroying metallic carbon nanotubes according to an embodiment of the present invention.

Then, as shown in FIG. 2, the semiconducting carbon nanotubes 2 and metallic carbon nanotubes 3 on the substrate 1 are irradiated with energy beams 5 from the irradiation energy source 4. The irradiation energy source 4 may be a laser source. Any other source may be used so long as it generates energy beams capable of selective mutual action with metallic carbon nanotubes 3. The energy of the energy beams should be established such that it equals the energy M11 for the first van Hove electronic transition of metallic carbon nanotubes 3. If the energy M11 for the first van Hove electronic transition of metallic carbon nanotubes 3 broadly ranges, it is necessary to use the energy beams 5 which have the energy levels covering the energy ranges for destruction of metallic carbon nanotubes 3. The laser as the irradiation energy source 4 should be multiwavelength laser or dye laser (with continuous oscillation and variable wavelength) so that its wavelengths cover the broad energy range. The energy beams 5 should have an adequate power density which is important. The energy beams 5 impinging on both metallic carbon nanotubes 3 and semiconducting carbon nanotubes 2 would destroy not only the former but also the latter if they have an excessively high energy density. By contrast, the energy beams 5 with an excessively low power density will not destroy metallic carbon nanotubes 3. The power density of the energy beams 5 should be 0.01 to 100 mW/$\mu$m$^2$, preferably 0.1 to 10 mW/$\mu$m$^2$. Duration of irradiation with the energy beams 5 varies depending on the power density of the energy beams 5, the density of metallic carbon nanotubes 3, and the state of aggregation of metallic carbon nanotubes 3.

Figure 3:
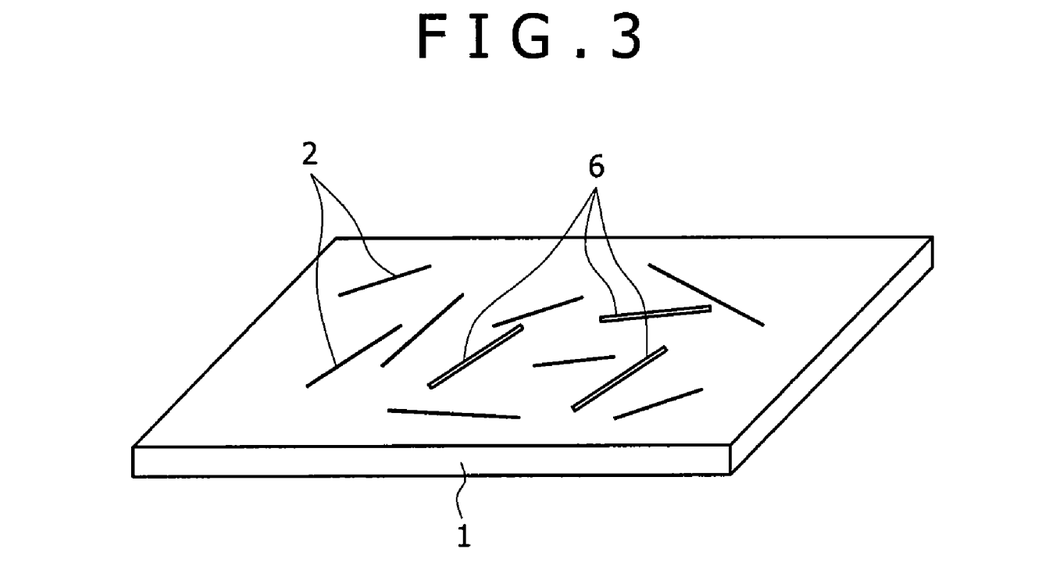
FIG. 3 is a schematic diagram illustrating the method for destroying metallic carbon nanotubes according to an embodiment of the present invention.

After irradiation with the energy beams 5 in the foregoing way, the semiconducting carbon nanotubes 2 retain their original structure whereas the metallic carbon nanotubes 3 are broken, with their current passage cut off, as shown in FIG. 3. The thus broken metallic carbon nanotubes are indicated by dotted lines (or reference numeral 6). They are selectively washed out with an adequate solvent such as H2O2, N,N-dimethylformamide (DMF), and N-methyl-2-pyrolidone (MNP).

Figure 4:
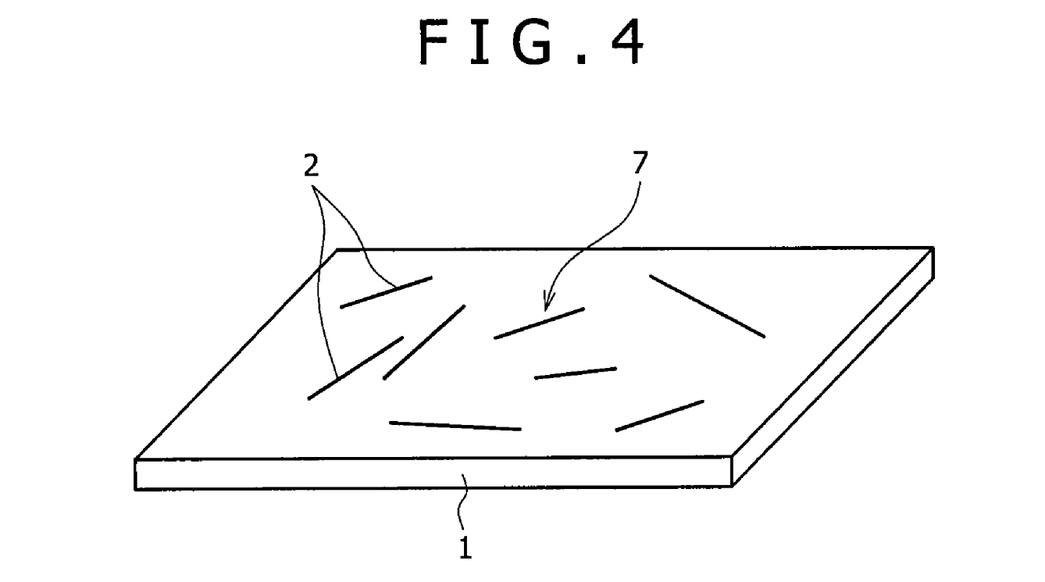
FIG. 4 is a schematic diagram illustrating the method for destroying metallic carbon nanotubes according to an embodiment of the present invention.

In this way a thin film 7 of semiconducting carbon nanotubes 2 is formed on the substrate 1, as shown in FIG. 4.

Figure 5:
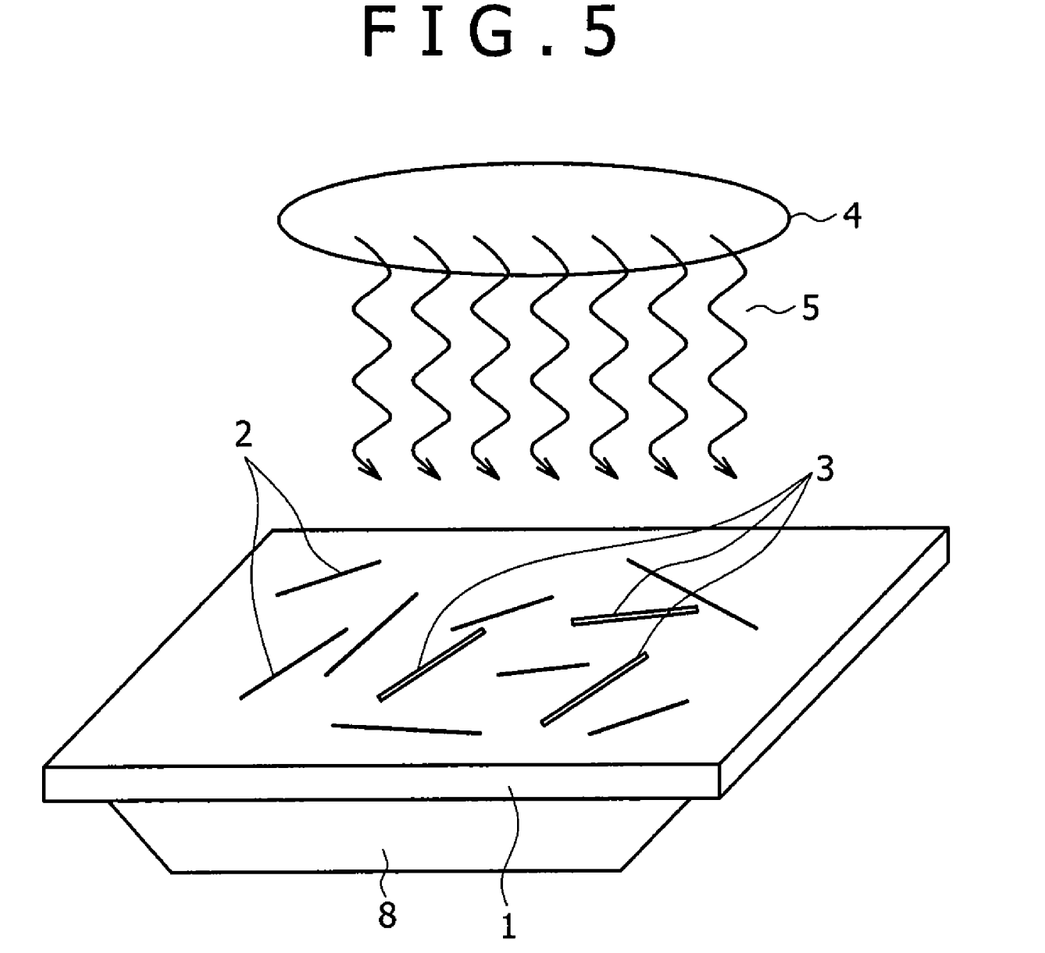
FIG. 5 is a schematic diagram illustrating the method for destroying metallic carbon nanotubes according to an embodiment of the present invention.

Irradiation with the energy beams 5 may be accomplished, with the substrate 1 heated on a hot plate 8, as shown in FIG. 5. Irradiation in this manner rapidly destroys the metallic carbon nanotubes 3 which are kept above room temperature. The metallic carbon nanotubes 3 may be heated to any temperature suitable for their heating environment, ranging from 300° C. in air up to 600° C. in inert gas.

Figure 6:
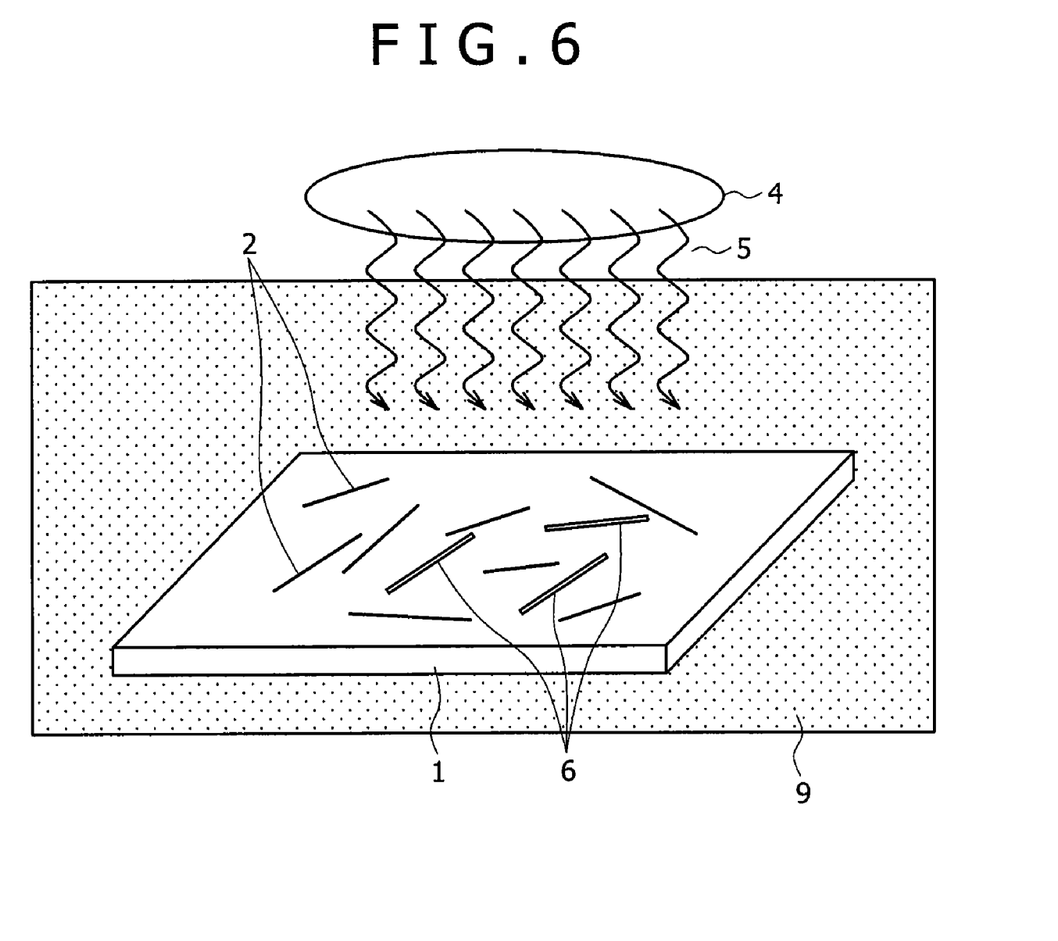
FIG. 6 is a schematic diagram illustrating the method for destroying metallic carbon nanotubes according to an embodiment of the present invention.
Figure 7:
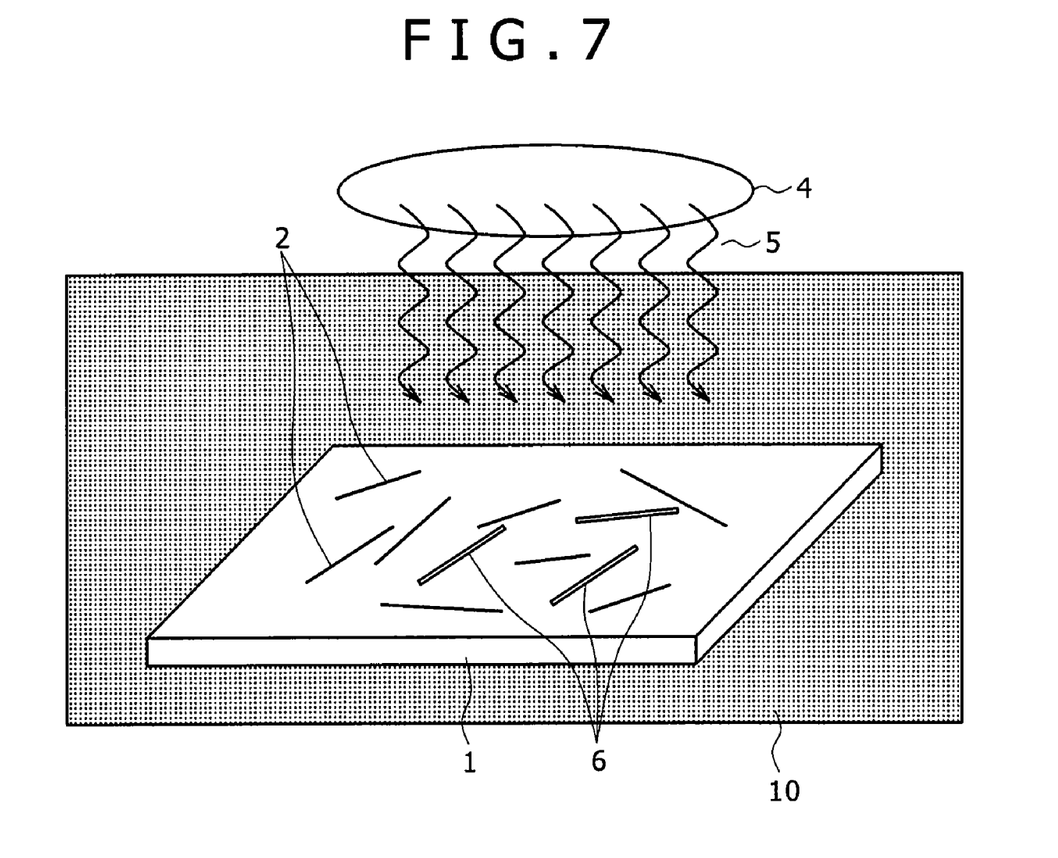
FIG. 7 is a schematic diagram illustrating the method for destroying metallic carbon nanotubes according to an embodiment of the present invention.

Irradiation with the energy beams 5 may be accomplished in any gaseous environment, such as air, O2, N2, O3, NO, CO2, CO, Br2, C12, F2, and H2, as shown in FIG. 6. Irradiation in this way subjects the metallic carbon nanotubes 3 to selective light-induced reactions. For example, irradiation with the energy beams 5 in air or O2 gas subjects the metallic carbon nanotubes 3 to selective oxidative reactions. Irradiation with the energy beams 5 may also be accomplished in a liquid environment 10 as shown in FIG. 7. Irradiation in this way subjects the metallic carbon nanotubes 3 to selective light-induced reactions. The liquid for the liquid environment may also function as a solvent that dissolves the destroyed metallic carbon nanotubes 6. Such a liquid includes H2O, DMF, and NMP. The destroyed metallic carbon nanotubes 6 may be removed with an alkaline aqueous solution of NaOH or KOH.

Figure 8:
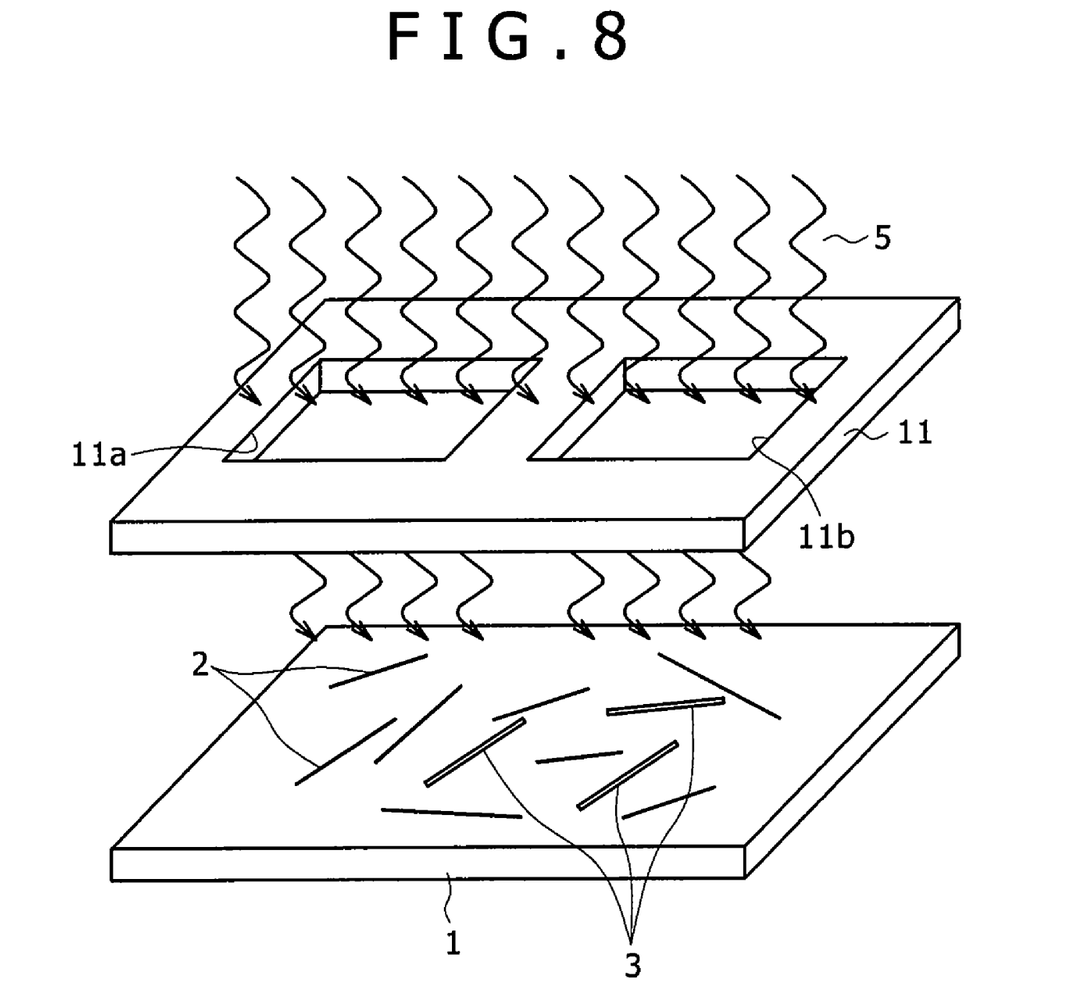
FIG. 8 is a schematic diagram illustrating the method for destroying metallic carbon nanotubes according to an embodiment of the present invention.

The energy beams 5 should sweep the entire surface of the substrate 1 if the metallic carbon nanotubes 3 on the substrate 1 are to be destroyed entirely. Otherwise, the energy beams 5 may sweep one or more regions on the substrate 1. This is illustrated in FIG. 8. In the case shown in FIG. 8, irradiation with the energy beams 5 is accomplished, with the metal mask 11 (having the opening 11a) placed on the substrate 1. The substrate 1 is irradiated with the energy beams 5 which have passed through the metal mask 11. Therefore, the irradiation region coincides with the pattern of the opening 11a, and only the metallic carbon nanotubes 3 in the region irradiated with the energy beams 5 are destroyed. The metal mask 11 may be replaced by a photomask, if laser beams are used as the energy beams 5. Alternatively, the energy beams 5 may be directed to selected regions without using the metal mask 11 or a photomask.

Irradiation in this manner destroys the metallic carbon nanotubes 3, while leaving the semiconducting carbon nanotubes 2 intact, in the desired regions, thereby creating the regions of semiconducting carbon nanotubes. In other words, it is possible to form the regions of semiconducting carbon nanotubes in any shape at any position. The regions left without irradiation with the energy beams 5 become metallic regions containing the metallic carbon nanotubes 3 remaining intact, and hence these regions may function as electrodes.

Figure 9:
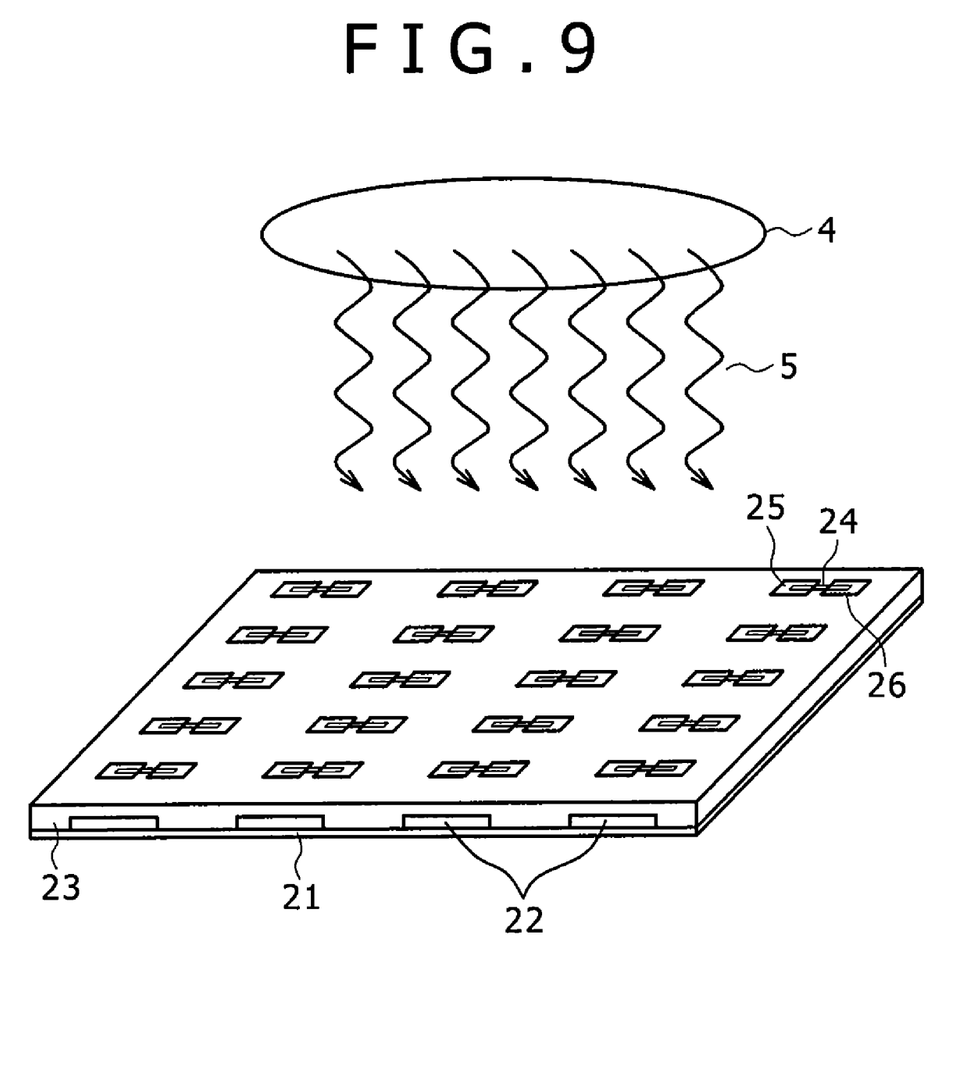
FIG. 9 is a schematic diagram illustrating the method for destroying metallic carbon nanotubes according to an embodiment of the present invention.

Irradiation with the energy beams 5 may be carried out before or after the FET structure of carbon nanotubes has been formed. FIG. 9 illustrates an example in which irradiation with the energy beams 5 is carried out after the FET structure of carbon nanotubes has been formed. The process shown in FIG. 9 proceeds as follows. First, a plurality of gate electrodes 22 (which extend in the same direction) are formed on the substrate 21. Then, the gate electrodes 22 are covered by the gate insulating film 23 of SiO2. The carbon nanotube aggregates 24 composed of carbon nanotubes (which extend in the direction perpendicular to the direction in which the gate electrodes 22 extend) are formed on that part of the gate insulating film 23 which is above the gate electrode 22. In this state, the carbon nanotube aggregates 24 are composed of metallic carbon nanotubes and semiconducting carbon nanotubes mixed together. The source electrode 25 and the drain electrode 26 are formed so that they cover both ends of the carbon nanotube aggregate 24. The carbon nanotube aggregate 24 is irradiated with the energy beams 5 (from the irradiation energy source 4), so that metallic carbon nanotubes in the carbon nanotube aggregate 24 are destroyed. Destruction of metallic carbon nanotubes in this way cuts the current passage (through metallic carbon nanotubes) between the source electrode 25 and the drain electrode 26. The remaining current passage between the source electrode 25 and the drain electrode 26 is now composed solely of semiconducting carbon nanotubes. The resulting carbon nanotube FET is capable of controlling the current flowing from the source electrode 25 to the drain electrode 26 in response to voltage applied to the gate electrode 22. In addition, irradiation with the energy beams 5 also produces annealing effect to improve the semiconducting carbon nanotubes in the carbon nanotube aggregates 24 in their characteristics of contact with the source electrode 25 and the drain electrode 26. Thus the method mentioned above permits the production of carbon nanotube FETs having good characteristic properties (such as on/off ratio).

Although the foregoing example is designed to selectively destroy the metallic carbon nanotubes 3, another example is possible which is designed to selectively destroy the semiconducting carbon nanotubes 2 by using the energy beams 5 having an energy level equal to the first van Hove electronic transition energy $S_{11}$ of the semiconducting carbon nanotubes 2.

EXAMPLE 1

Figure 10:
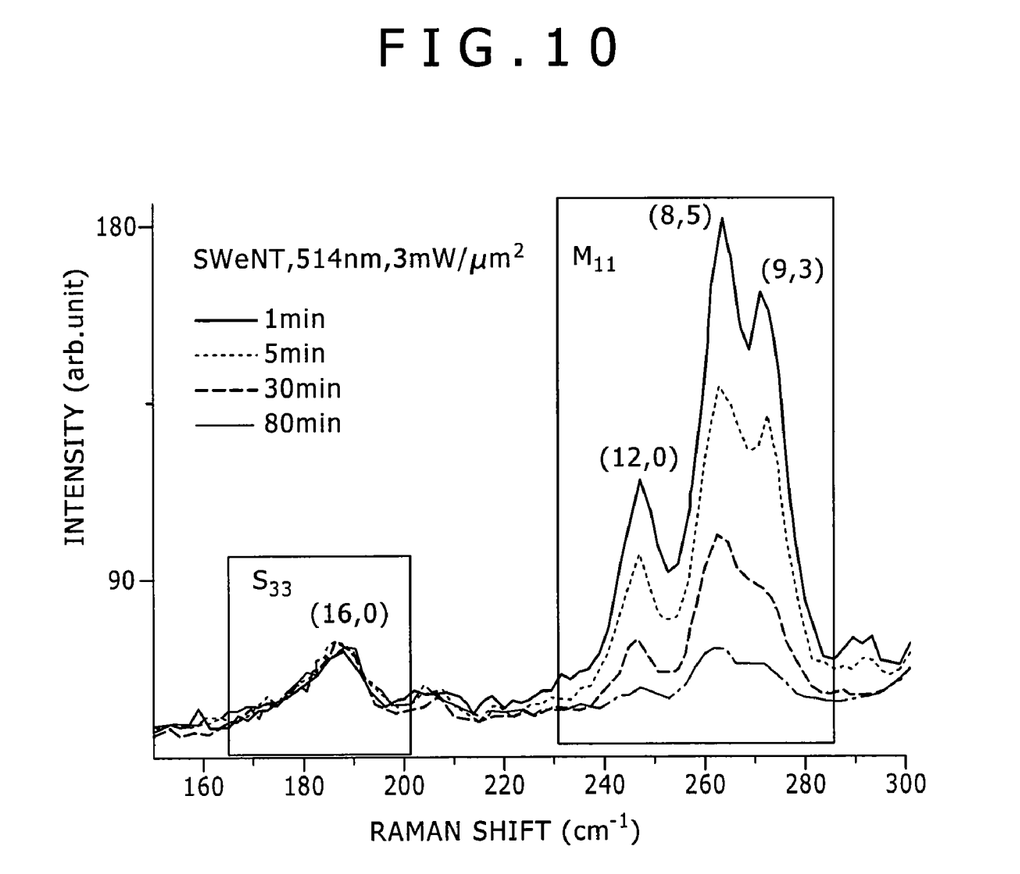
FIG. 10 is a schematic diagram illustrating a Raman spectrum obtained in Example 1 of the present invention.

Single-wall carbon nanotubes (commercially available under a trade name of SweNT from Southwest Nanotechnologies Inc.) were examined by irradiation with laser light at a wavelength of 514 nm and a power density of 3 mW/μm². The resulting Raman spectrum in the region of RBM (radial breathing mode) is shown in FIG. 10. The laser with the specified energy gives rise to Raman signals at 150-215 cm$^{-1}$ due to the third van Hove electron transition $S_{33}$ of semiconducting carbon nanotubes and also gives rise to Raman signals at 230-300 cm$^{-1}$ due to the first van Hove electron transition $M_{11}$ of metallic carbon nanotubes. These Raman spectra are normalized for the G mode peak in the neighborhood of 1590 cm$^{-1}$. It is noted that irradiation with the laser light causes signals from metallic carbon nanotubes to sharply decrease in intensity, with signals from semiconducting carbon nanotubes remaining almost unchanged. To be concrete, irradiation for 80 minutes causes signals from metallic carbon nanotubes to decrease in intensity by about 85%. Further decrease in intensity of signals from metallic carbon nanotubes is not clear on account of the bundle effect of carbon nanotubes.

Figure 11:
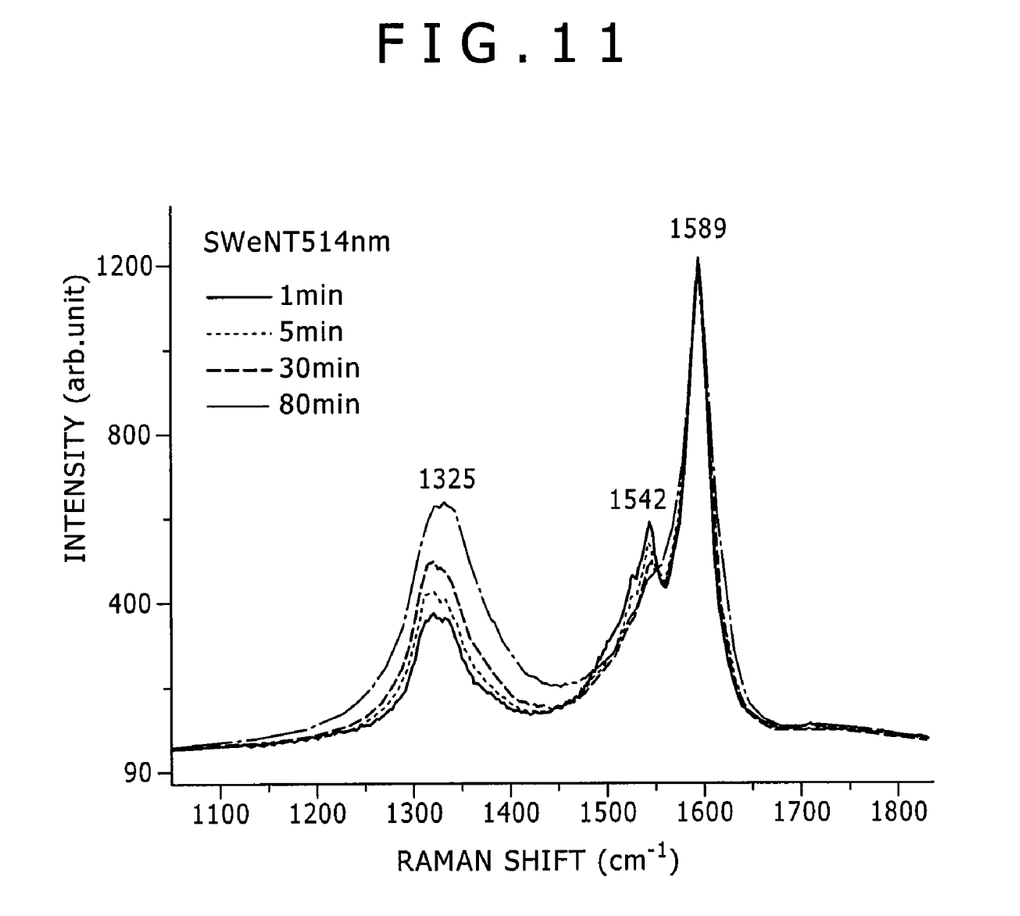
FIG. 11 is a schematic diagram illustrating a Raman spectrum obtained in Example 1 of the present invention.

Single-wall carbon nanotubes were examined by irradiation with laser light at a wavelength of 514 nm. The resulting Raman spectrum in the region of tangential mode (G and D) is shown in FIG. 11. This Raman spectrum was observed at the same time as the one shown in FIG. 10. It is normalized for the G mode peak in the neighborhood of 1542 cm-1. The peak (having the shape of the so-called BWF (Breit-Wigner-Fano) line) in the neighborhood of 1542 cm-1 is attributable mainly to metallic carbon nanotubes. This peak intensity decreases as irradiation with the laser light proceeds in the same way as signals observed in the RBM region. This indicates that metallic carbon nanotubes have been selectively destroyed. The increase in peak strength in the D-mode region (about 1320 cm-1) is another evidence for the destruction of metallic carbon nanotubes. It is concluded from the changes in signals of metallic carbon nanotubes in the RBM and BWF regions that the increase of peak strength in the D-mode region is due to the destruction of metallic carbon nanotubes.

EXAMPLE 2

It was noticed in Example 1 that metallic carbon nanotubes (having a smaller diameter) and semiconducting carbon nanotubes (having a larger diameter) give, upon irradiation with laser light having a wavelength of 514 nm, give a change in Raman spectrum in the RBM region. Someone might point out that the change in Raman spectrum is associated with the tube size because carbon nanotubes with a smaller diameter are usually more sensitive to irradiation with laser light. However, the present inventors believe that the effect of irradiation is governed by the tube type (metallic or semiconducting) rather than the tube size. In order to prove their belief, the present inventors carried out irradiation with laser light having a wavelength of 632.8 nm for detection of metallic carbon nanotubes (having a larger diameter) and semiconducting carbon nanotubes (having a smaller diameter), both in the RBM region.

Figure 12:
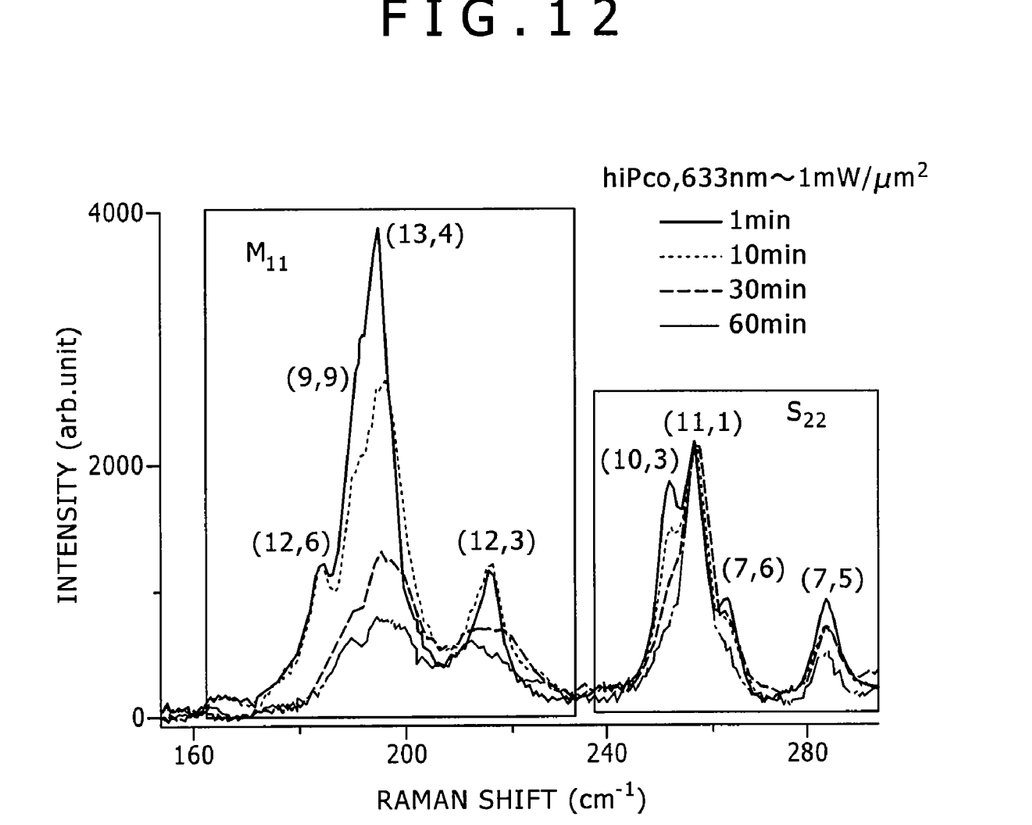
FIG. 12 is a schematic diagram illustrating a Raman spectrum obtained in Example 2 of the present invention.

Commercial single-wall carbon nanotubes (HiPco) were examined by irradiation with laser light at a wavelength of 632.8 nm and a power density of about 1 mW/□m². The resulting Raman spectrum in the RBM region is shown in FIG. 12. The Raman spectrum is normalized for the G-mode peak in the neighborhood of 1590 cm-1. Signals of 160-240 cm-1 are attributable to metallic carbon nanotubes, and signals of 240-300 cm-1 are attributable to semiconducting carbon nanotubes. The diameter of the carbon nanotubes may be estimated from the formula d=224/(ωRBM−14), where d is the diameter and ωRBM is the Raman shift. Therefore, the major components of carbon nanotubes detected by laser light having a wavelength of 632.8 nm include metallic carbon nanotubes having a diameter of about 1.3 nm and semiconducting carbon nanotubes having a diameter of about 0.9 nm.

Although RBM Raman signals change more intricately when irradiated with laser light of wavelength 514 nm than when irradiated with laser light of wavelength 632.8 nm, the general tendency is the same. That is, metallic carbon nanotubes are destroyed more easily. The peak (at about 195 cm-1) due to metallic carbon nanotubes (13,4) decreases by 80%, whereas the peak (at about 257 cm-1) due to semiconducting carbon nanotubes (11,1) (having a chiral angle θ=4.3°) remains almost unchanged. It is interesting to note that irradiation with the laser light easily destroys those carbon nanotubes having a larger chiral angle, such as semiconducting carbon nanotubes (7,6) (θ=27.5°) and (10,3) (θ=12.7°) and metallic carbon nanotubes (9,9) (θ=30°). It can be the that irradiation with laser light is effective not only in the destruction of metallic carbon nanotubes but also in the fine adjustment of the electronic structure of the mixture of metallic carbon nanotubes and semiconducting carbon nanotubes.

Figure 13:
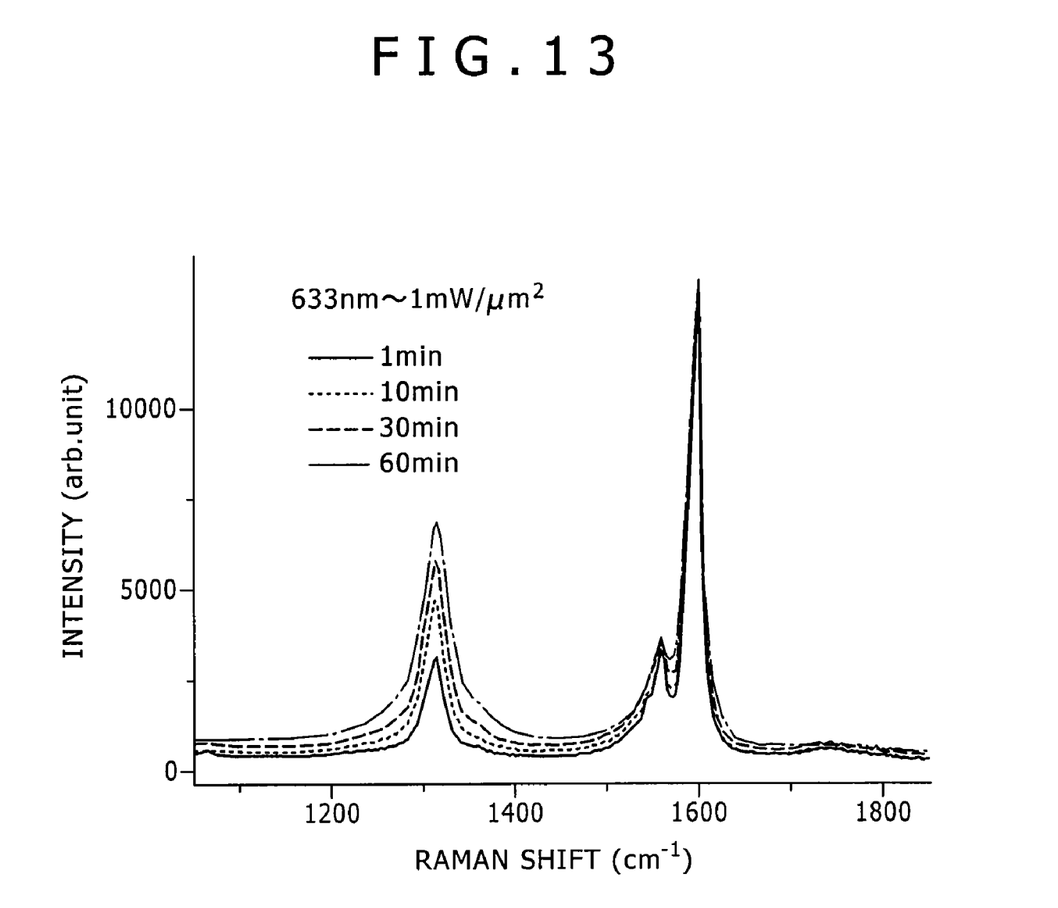
FIG. 13 is a schematic diagram illustrating a Raman spectrum obtained in Example 2 of the present invention.

Single-wall carbon nanotubes (HiPco) were irradiated with laser light having a wavelength of 632.8 nm. The change in Raman spectrum in the tangential mode region is shown in FIG. 13. As in the case of irradiation with laser light having a wavelength 514 nm, the increase in D-mode peak intensity indicates the destruction of metallic carbon nanotubes.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A method for destroying metallic carbon nanotubes comprising irradiating metallic carbon nanotubes with energy beams, wherein the energy beams have an irradiation power density ranging from 10-³ mW/μm² to 10³ mW/μm².

2. The method for destroying metallic carbon nanotubes as defined in claim 1, wherein the energy beams have energy components for resonance absorption by the metallic carbon nanotubes.

3. The method for destroying metallic carbon nanotubes as defined in claim 1, wherein the energy beams have energy components equal to a first electron excitation energy of metallic carbon nanotubes.

4. The method for destroying metallic carbon nanotubes as defined in claim 1, wherein the metallic carbon nanotubes are single-wall carbon nanotubes.

5. A method for destroying metallic carbon nanotubes comprising irradiating metallic carbon nanotubes with energy beams, wherein the energy beams are laser light.

6. The method for destroying metallic carbon nanotubes as defined in claim 5, wherein the energy beams have energy components for resonance absorption by the metallic carbon nanotubes.

7. The method for destroying metallic carbon nanotubes as defined in claim 5, wherein the energy beams have energy components equal to a first electron excitation energy of metallic carbon nanotubes.

8. The method for destroying metallic carbon nanotubes as defined in claim 5, wherein the metallic carbon nanotubes are single-wall carbon nanotubes.

9. A method for destroying semiconducting carbon nanotubes, the method comprising irradiating with energy beams for destruction of semiconducting carbon nanotubes.

10. The method for destroying semiconducting carbon nanotubes as defined in claim 9, wherein the energy beams have energy components for resonance absorption by the semiconducting carbon nanotubes.

11. A method for producing an aggregate of metallic carbon nanotubes, the method comprising:
   irradiating a mixture of metallic carbon nanotubes and semiconducting carbon nanotubes with energy beams; and
   selectively destroying the semiconducting carbon nanotubes.

12. A method for producing a thin film of metallic carbon nanotubes, the method comprising:
   irradiating a thin film formed from a mixture of metallic carbon nanotubes and semiconducting carbon nanotubes with energy beams; and
   selectively destroying the semiconducting carbon nanotubes.

13. A method for producing an electronic element with aggregate of metallic carbon nanotubes, the method comprising:
   forming a mixture of metallic carbon nanotubes and semiconducting carbon nanotubes;
   irradiating the mixture with energy beams; and
   selectively destroying the semiconducting carbon nanotubes and forming the aggregate of metallic carbon nanotubes.

14. A method for producing an electronic element with thin film of metallic carbon nanotubes, the method comprising:
   forming a thin film from a mixture of metallic carbon nanotubes and semiconducting carbon nanotubes;
   irradiating the thin film with energy beams; and
   selectively destroying the semiconducting carbon nanotubes and forming the thin film of metallic carbon nanotubes.

15. A method for producing carbon nanotube aggregate, the method comprising:
   irradiating carbon nanotube aggregate containing at least more than one type of semiconducting carbon nanotubes with energy beams; and
   selectively destroying at least one type of the semiconducting carbon nanotubes.

16. A method for producing carbon nanotube aggregate, the method comprising:
   irradiating carbon nanotube aggregate containing at least more than one type of metallic carbon nanotubes with energy beams; and
   selectively destroying at least one type of the metallic carbon nanotubes.

* * * * *